United States Patent
Zhao et al.

(10) Patent No.: US 11,933,845 B2
(45) Date of Patent: Mar. 19, 2024

(54) BOUNDARY SCAN TEST METHOD AND STORAGE MEDIUM

(71) Applicant: SHENZHEN PANGO MICROSYSTEMS CO.,LTD., Shenzhen (CN)

(72) Inventors: Shiyjun Zhao, Shenzhen (CN); Puxia Liu, Shenzhen (CN); Qipan Fu, Shenzhen (CN)

(73) Assignee: SHENZHEN PANGO MICROSYSTEMS CO., LTD., Guangdong Province (CN)

( * ) Notice: Subject to any disclaimer, the term of this patent is extended or adjusted under 35 U.S.C. 154(b) by 0 days.

(21) Appl. No.: 17/906,980

(22) PCT Filed: Mar. 24, 2021

(86) PCT No.: PCT/CN2021/082534
§ 371 (c)(1),
(2) Date: Sep. 22, 2022

(87) PCT Pub. No.: WO2022/088594
PCT Pub. Date: May 5, 2022

(65) Prior Publication Data
US 2023/0120955 A1 Apr. 20, 2023

(30) Foreign Application Priority Data
Oct. 28, 2020 (CN) .......................... 202011171203.9

(51) Int. Cl.
*G01R 31/3185* (2006.01)

(52) U.S. Cl.
CPC ........... *G01R 31/318544* (2013.01); *G01R 31/318569* (2013.01)

(58) Field of Classification Search
None
See application file for complete search history.

(56) References Cited

U.S. PATENT DOCUMENTS

| 5,627,842 A | 5/1997 | Brown et al. |
| 6,163,864 A | 12/2000 | Bhavsar et al. |
| 6,975,980 B2 * | 12/2005 | Whetsel ......... G01R 31/318555 714/724 |

(Continued)

OTHER PUBLICATIONS

G. Gibson, L. Gray and C. Stroud, "Boundary scan access of built-in self-test for field programmable gate arrays," Proceedings. Tenth Annual IEEE International ASIC Conference and Exhibit (Cat. No. 97TH8334), Portland, OR, USA, 1997, pp. 57-61, doi:10.1109/ASIC.1997.616978. (Year: 1997).*

*Primary Examiner* — Daniel F. McMahon

(57) ABSTRACT

A boundary scan test method is used to test connectivity of a pad having a direct connection to user logic. The method comprises the following steps: configuring an FPGA to enter a test mode; generating by means of user logic, a boundary scan chain for a boundary scan test; loading a boundary scan test instruction to the FPGA, and loading a PRELOAD instruction to a device having a pad to be tested for connectivity; sending, via a TDI port, a first test vector to the pad; performing the boundary scan test, and loading an EXTEST instruction to the device having the pad; and removing first response data from a TDO port, and performing response analysis and fault diagnosis.

16 Claims, 4 Drawing Sheets

(56) References Cited

U.S. PATENT DOCUMENTS

| | | | | |
|---|---|---|---|---|
| 7,308,656 | B1* | 12/2007 | Roberts | G01R 31/318591 |
| | | | | 714/33 |
| 7,480,843 | B1* | 1/2009 | Jacobson | G01R 31/31855 |
| | | | | 714/725 |
| 7,506,210 | B1* | 3/2009 | Bridgford | G01R 31/31705 |
| | | | | 714/37 |
| 9,728,273 | B2* | 8/2017 | Chakraborty | G11C 29/12015 |
| 9,791,505 | B1* | 10/2017 | Narayanan | G01R 31/318536 |
| 2003/0163773 | A1* | 8/2003 | O'Brien | G01R 31/318558 |
| | | | | 714/726 |
| 2003/0217306 | A1* | 11/2003 | Harthcock | G06F 11/2294 |
| | | | | 714/30 |
| 2004/0097093 | A1* | 5/2004 | Fukuyama | G11C 29/30 |
| | | | | 438/735 |
| 2013/0085704 | A1* | 4/2013 | Stanley | G01R 31/318572 |
| | | | | 702/118 |

* cited by examiner

BOUNDARY SCAN TEST METHOD AND STORAGE MEDIUM

FIELD OF THE INVENTION

The present invention relates to the field of chip test, in particular to a boundary scan test method and a storage medium.

BACKGROUND

JTAG (Joint Test Action Group) is an international standard test protocol (IEEE1149.1 compatible), mainly used for chip internal test. Most of the advanced devices currently support the JTAG protocol, such as DSP, FPGA devices, etc. JTAG test refers to applying test stimulus and analyzing test response through JTAG pins, so as to realize fault diagnosis of the circuit under test. Boundary scan test (BST) refers to the test of digital circuits using the boundary scan unit of chip pins (PAD) through the JTAG bus. Boundary scan test has the advantages of simplicity and convenient, which can cover the entire product cycle of research, production and maintenance, and can greatly reduce the test cost of the product. The boundary scan unit is placed on the input port, output port, bidirectional port, and tristate port of the device signal, the boundary scan units are connected together to form a boundary scan chain. Currently, boundary scan test is implemented by hardware; however, implementing boundary scan by hardware has a relatively large disadvantage. First, since the boundary scan test needs to be performed on all PADs, the test time is long; secondly, the test arrangement is inflexible, and the PADs under test cannot be configured.

In view of this, a new boundary scan test method is urgently needed to solve the above problems, so as to realize faster and more flexible boundary scan test and improve test efficiency.

SUMMARY

An object of the invention is to provide a boundary scan test method and a storage medium so ad to achieve the boundary scan test more quickly.

In order to achieve the above object, the invention provides a boundary scan test method for testing the connectivity of a pad having a direct connection to user logic, and the method comprises the following steps:

A boundary scan test method for testing the connectivity of a PAD having a direct connection to user logic comprising the following steps:
S10, configuring an FPGA to enter a test mode;
S20, generating a boundary scan chain for a boundary scan test by means of the user logic;
S30, loading a boundary scan test instruction to the FPGA, and loading a PRELOAD instruction to a device having a PAD to be tested for connectivity;
S40, sending, a first test vector to the PAD via a TDI port;
S50, performing the boundary scan test, and loading an EXTEST instruction to the device having the PAD; and
S60, removing first response data from a TDO port and performing response analysis and fault diagnosis.

According to the method of the invention, the boundary scan chain comprises several scan chain units which are connected in series to form a scan chain.

According to the method of the invention, the boundary scan chain comprises m scan chain units, the FPGA comprises n PADs, where m≤n.

According to the method of the invention, the step "S10, configuring an FPGA to enter a test mode" further comprises:
invoking the test interface of the boundary scan chain, opening the channel connecting the FPGA and the user logic, and entering the test mode.

According to the method of the invention, the step "S20, generating a boundary scan chain for a boundary scan test by means of the user logic" further comprises: according to the position and quantity of the PAD, generating a boundary scan chain corresponding to the PADs one by one through the user logic.

According to the method of the invention, the step "S40, sending a first test vector the pad via a TDI port" further comprises:
entering the SHIFT-DR state, shifting the first test vector serially to the PAD through the TDI port; and
entering the UPDATE-DR state and updating the first test vector to the boundary scan register of the boundary scan chain in parallel.

According to the method of the invention, the step "S50, performing the boundary scan test, and loading an EXTEST instruction to the device having the PAD" further comprises:
loading the EXTEST instruction into the device having the PAD;
loading the first test vector for outer testing.

According to the method of the invention, the step "S60, removing first response data from a TDO port, and performing response analysis and fault diagnosis" further comprises:
removing the first response data from the TDO port, while sending the next test vector to the next PAD.

According to the method of the invention, "removing the first response data from the TDO port, while sending the next test vector to the next pad" further comprises:
entering the CAPTURE-DR state, and capturing the first response data into the boundary scan register of the boundary scan chain in parallel;
entering the SHIFT-DR state, serially moving out the first response data, and simultaneously moving the next test vector into the next PAD; and
entering the UPDATE-DR state, and updating the next test vector into the boundary scan register of the boundary scan chain in parallel.

The present invention further provides a storage medium, in which the storage medium stores at least one computer program, when the at least one computer program is executed by a processor, the foregoing boundary scan test method can be implemented.

The technical advantages of the invention include that the boundary scan testing method generates a boundary scan chain for boundary scan testing through user logic according to the boundary scan test method and storage medium of the invention. The boundary scan testing method of the invention does not require hardware upgrade. Software configuration is performed in FPGA user logic with respect to a PAD to be tested, such that the PAD can be tested according to the configuration without testing or passing through PADS that do not need to be tested. The method shortens boundary scan chains, thereby enabling rapid and flexible boundary scan tests and improving test efficiency.

DETAILED DESCRIPTION OF THE INVENTION

In order to facilitate understanding of the invention, the invention will be described more fully below with reference to the related drawings. The preferred embodiments of the invention are shown in the accompanying drawings. However, the invention may be implemented in many different forms and is not limited to the embodiments described herein. Rather, these embodiments are provided so that a thorough and complete understanding of the invention of this invention is provided.

Unless otherwise defined, all technical and scientific terms used herein have the same meaning as commonly understood by one of ordinary skill in the technical field to which this invention belongs. The terms used herein in the specification of the invention are intended only to describe specific embodiments only, and are not intended to limit the invention.

As shown in FIG. 1 to FIG. 4, the boundary scan test method according to the embodiment of the invention is provided.

Figure 1:
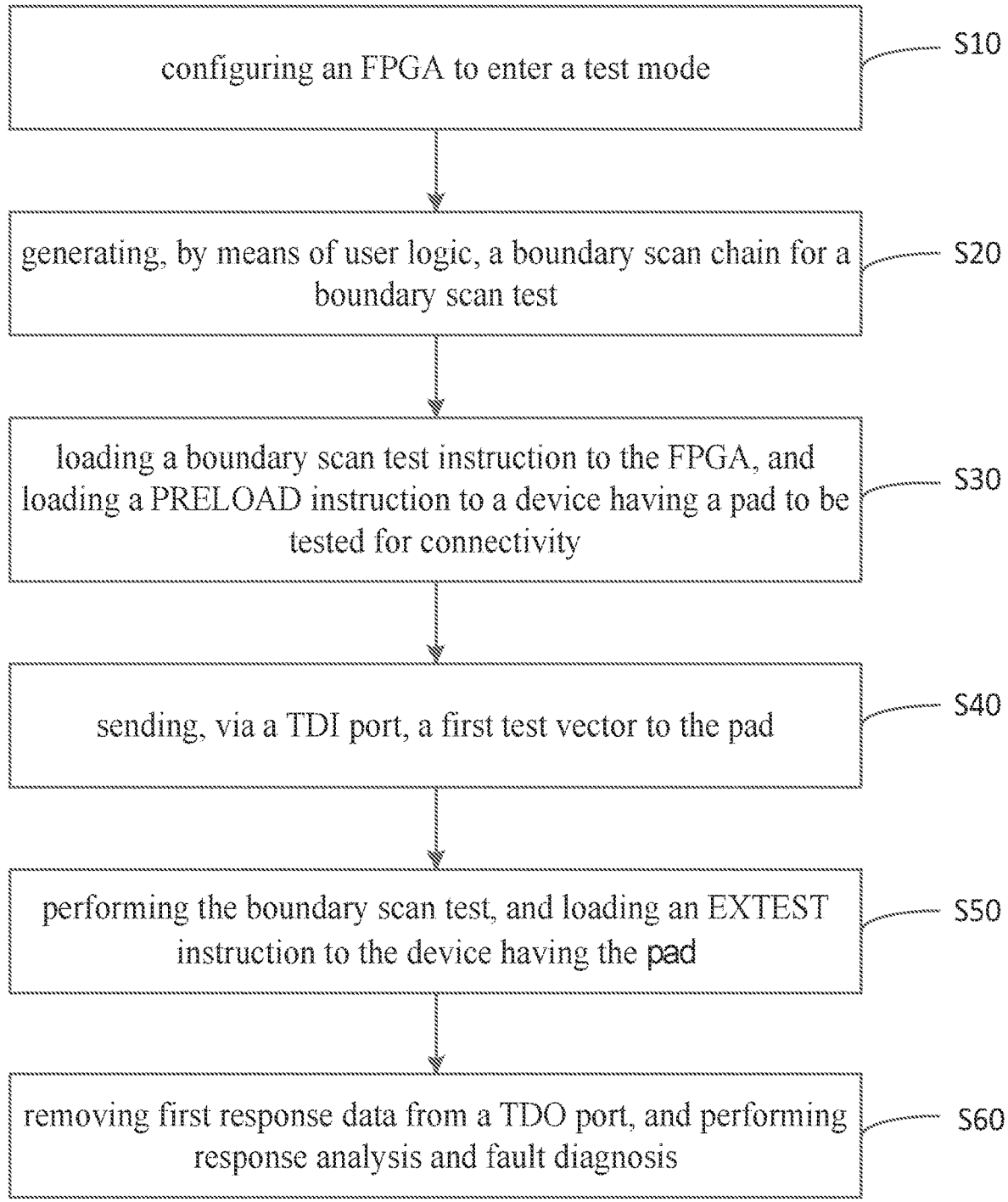
FIG. 1 illustrates the flow chart of a boundary scan test according to an embodiment of this invention.

The boundary scan test method is used to test the connectivity of a PAD having a direct connection to user logic. As shown in FIG. 1, the boundary scan test method comprises the following steps:

S10, invoking SCAN CHAIN GTP interface which is an interface between an FPGA and user logic, invoking the interface to open the channel connecting FPGA and user logic, and configuring the FPGA to enter a test mode;

S20, generating a boundary scan chain for a boundary scan test by means of user logic;

S30, loading a boundary scan test instruction to the FPGA, and loading a PRELOAD instruction to a device having a PAD to be tested for connectivity;

S40, sending a first test vector to the PAD through the TDI (Test Data Input) port;

S50, performing the boundary scan test, and loading an EXTEST instruction to the device having the PAD; and S60, removing first response data from TDO (Test Data Output) port for response analysis and fault diagnosis.

Further, the step "S20, generating a boundary scan chain for a boundary scan test by means of user logic" specifically comprises: according to the position and quantity of the PAD, generating a boundary scan chain corresponding to the pad one by one through the user logic. The boundary scan chain comprises several scan chain units connected in series, and each scan chain unit comprises a data unit and a control unit. The SI (shift input) of the first scan chain unit of the boundary scan chain is connected to TDI, the SO (shift output) of the first scan chain unit is connected to the SI of the second scan chain unit, and the SO of the second scan chain unit is connected to the SI of the third scan chain unit, and so on, the SO of the mth (last one) scan chain unit is connected to TDO.

Further, the boundary scan chain comprises m scan chain units, and the FPGA comprises n PADs, where m≤n. Since the boundary scan chains are generated in a one-to-one correspondence according to the PAD under test, the number m of scan chain units is less than or equal to n. In an alternative embodiment, if the FPGA has 500 PADs, and the number of PADs under test is 300, it is only necessary to correspondingly generate a boundary scan chain corresponding to the PADs under test. That is, the number of generated scan chain units is 300. During the boundary scan test, the test vector is directly moved into the PAD under test by the boundary scan chain generated by the user logic, which greatly shortens the length of the boundary scan chain, saves the test time, and has higher flexibility.

Further, the PAD is controlled to be an input state or an output state by the control unit. For the input PAD, in the CAPTURE-DR state, the input value is captured to the data unit, and in the UPDATE-DR state, the value of the shift register in the control unit is updated to the second stage register; for the output PAD, in the UPDATE-DR state, update the value of the shift register in the data unit and the control unit to the second-level register.

Further, step S30 loads the boundary scan test instructions into the FPGA, and loads the PRELOAD instruction into a device having a PAD to be tested for connectivity, wherein the device having a PAD to be tested for connectivity is the device where the PAD of the FPGA under test is located. It is an FPGA, or it can be an upper-level device of the FPGA, a lower-level device of the FPGA, and so on.

Figure 2:
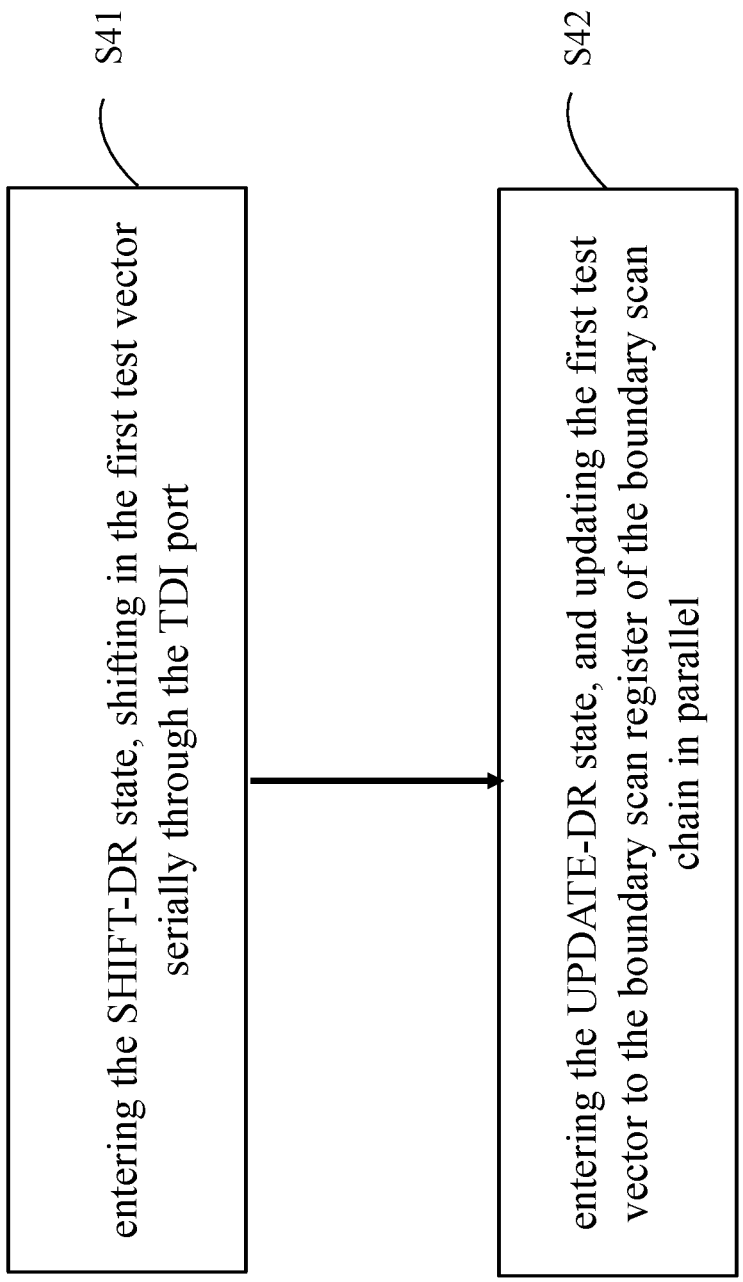
FIG. 2 illustrates the flow chart of step S40 of the boundary scan test method shown in FIG. 1.

Further, please refer to FIG. 2, the step "S40, sending the first test vector to the PAD through the TDI port" comprises:

S41, entering the SHIFT-DR state, shifting in the first test vector serially through the TDI port;

S42, entering the UPDATE-DR state, and updating the first test vector to the boundary scan register of the boundary scan chain in parallel.

Among them, in the SHIFT-DR state, the test vector is moved into the boundary scan register through the boundary scan chain. As TCK rises, the test data register placed on the TDI to TDO boundary scan link is shifted one bit in the direction of TDO; the test data register is selected by the current test instruction, but not placed on the TDI to TDO boundary scan link, it will keep the original state.

In the UPDATE-DR state, as TCK falls, the data from the shift register path is latched into the parallel output of the test data register.

Figure 3:
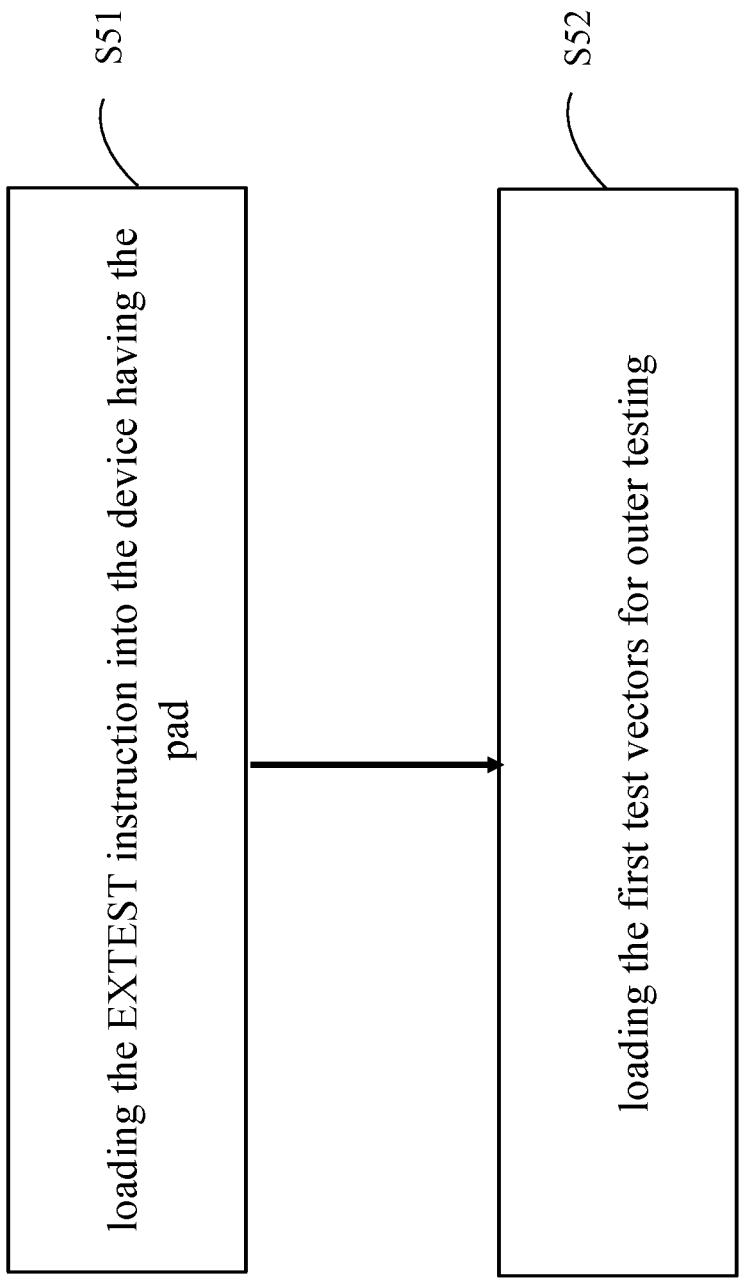
FIG. 3 illustrates the flow chart of step S50 of the boundary scan test method shown in FIG. 1.

Further, please refer to FIG. 3, step "S50, performing the boundary scan test, and loading an EXTEST instruction to the device having the PAD" also comprises:

S51, loading the EXTEST instruction into the device having the PAD;

S52, loading the first test vector for outer testing.

Among them, the EXTEST instruction is used to realize the boundary scan external test, and the external test is used for the interconnection test between the pads. Before executing the EXTEST instruction, the PRELOAD instruction operation needs to be performed to pre-install the test vector. Once the external test instruction takes effect, the pre-installed test vector will be moved to the output pad to ensure that the output pad state is controllable.

Further, the step S60 of the boundary scan test method in the embodiment removes the first response data from the TDO (test data output) port for response analysis and fault diagnosis. It also comprises the step of removing the first response data from the TDO port while sending a second test vector to a second PAD.

Figure 4:
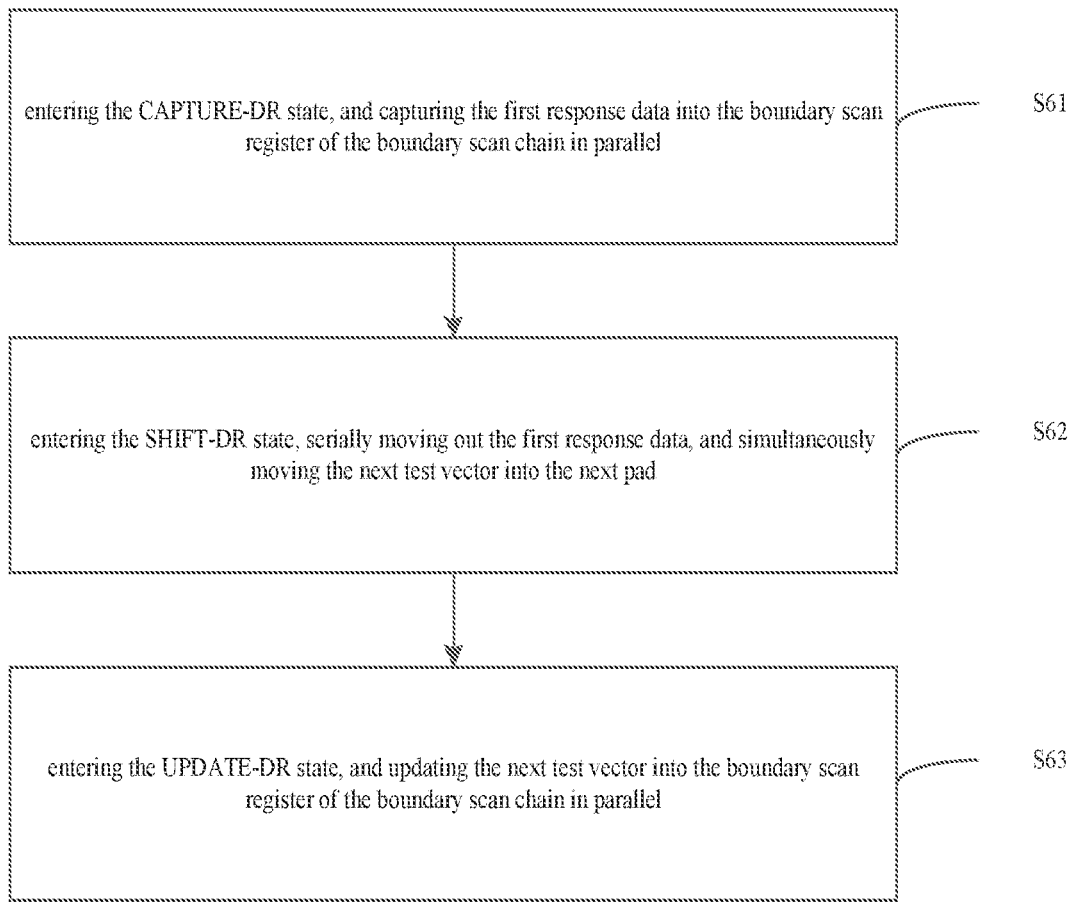
FIG. 4 illustrates the flow chart of step S60 of the boundary scan test method shown in FIG. 1.

Please refer to FIG. 4, step S60 specifically comprises:

S61, entering the CAPTURE-DR state, and capturing the first response data into the boundary scan register of the boundary scan chain in parallel;

S62, entering the SHIFT-DR state, serially moving out the first response data, and simultaneously moving the next test vector into the next PAD;

S63, entering the UPDATE-DR state, and updating the next test vector into the boundary scan register of the boundary scan chain in parallel.

When the Nth response data is removed from the TDO port, the N+1th test vector is sent for response analysis and fault diagnosis, and the test mode is ended after all the tests of the PAD under test are completed.

The boundary scan test method of the invention can also be used for board level interconnect testing. In an alternative embodiment, there are three test chips, including an FPGA, an upper-level device, and a lower-level device; wherein the TDO of the upper-level device is connected to the TDI of the FPGA, and the TDO of the FPGA is connected to the TDI of the lower-level device; there are 6 board interconnection test combinations which comprises: FPGA to lower-level device, FPAG to upper-level device, lower-level device to upper-level device, lower-level device to FPGA, upper-level device to lower-level device, upper-level device to FPGA. In another optional embodiment, there are five test chips, including FPGA1, FPGA2, device 1, device 2, and device 3; there are 20 board interconnection test combinations.

As an example, three test chips are used to test the connectivity of a PAD for FPGA to lower devices, which comprise:

S10, invoking the SCAN CHAIN GTP interface, opening the connection channel between the FPGA and the user logic, and configuring the FPGA to enter the test mode;

S20, according to the position and quantity of the PAD under test, a boundary scan chain corresponding to the PAD under test one-to-one being generated through user logic, in which there are a total of 500 PADs on the FPGA, and the number of PADs under test is 300, so it is only necessary to generate a boundary scan chain corresponding to the number of PADs under test, that is, the number of generated scan chain units is 300; When testing, the test vector being moved into the PAD under test through the boundary scan chain generated by the user logic;

S30, the loading test instruction being the connectivity between FPGA output PAD under test and lower device input PAD under test, and loading PRELOAD instruction into lower device.

S40, sending the first test vector to the output PAD under test through the generated boundary scan chain which is generated through the TDI port;

S50, loading the EXTEST instruction into the lower-level device, and moving the first test vector from the output PAD under test to the input PAD under test;

S60, the first response data being removed from the lower device port for response analysis and fault analysis; at the same time, the next test vector being sent for boundary scan testing until all response data output and analysis being completed.

In the boundary scan testing method of the invention, software configuration is performed in FPGA user logic with respect to a PAD to be tested, such that the PAD can be tested according to the configuration without the need to test or pass through PADs that do not need to be tested. The method shortens boundary scan chains, thereby enabling rapid and flexible boundary scan tests and improving test efficiency.

The invention further provides a storage medium which stores at least one computer program. When the at least one computer program is executed by the processor, the foregoing boundary scan test method is implemented.

The above examples only represent the preferred embodiments of the invention, and the descriptions thereof are relatively specific and detailed, but should not be construed as limiting the scope of the invention. It should be pointed out that for those skilled in the art, without departing from the concept of the invention, several modifications and improvements can be made, which all belong to the protection scope of the invention. Therefore, the scope of protection of the patent invention shall be subject to the appended claims.

What is claimed is:

1. A boundary scan test method for testing the connectivity of a PAD having a direct connection to user logic comprising the following steps:
   configuring an FPGA to enter a test mode;
   configuring a boundary scan chain for a boundary scan test by means of the user logic;
   loading a boundary scan test instruction to the FPGA, and loading a PRELOAD instruction to a device having a PAD to be tested for connectivity;
   sending, a first test vector to the PAD via a TDI port;
   performing the boundary scan test, and loading an EXTEST instruction to the device having the PAD; and
   removing first response data from a TDO port and performing response analysis and fault diagnosis: wherein the step "configuring a boundary scan chain for a boundary scan test by means of the user logic" further comprises: according to a position and a quantity of PADs to be tested, configuring a boundary scan chain corresponding to the PADs to be tested one by one through the user logic:
   the PAD is controlled to be an input state or an output state by the control unit, for the input PAD, in the CAPTURE-DR state, the input value is captured to the data unit, and in the UPDATE-DR state, the value of the shift register in the control unit is updated to the second stage register; for the output PAD, in the UPDATE-DR state, update the value of the shift register in the data unit and the control unit to the second-level register.

2. The method of claim 1, wherein the boundary scan chain comprises several scan chain units which are connected in series to form a scan chain.

3. The method of claim 2, wherein the boundary scan chain comprises m scan chain units, the FPGA comprises n PADS, where m≤n.

4. The method of claim 1, wherein the step configuring an FPGA to enter a test mode further comprises:
   invoking a test interface of the boundary scan chain, and opening a channel connecting the FPGA and the user logic to enter the test mode.

5. The method of claim 1, wherein the step "sending a first test vector to the pad via a TDI port" further comprises:
   entering a SHIFT-DR state, shifting the first test vector serially to the PAD through the TDI port; and
   entering a UPDATE-DR state, and updating the first test vector to a boundary scan register of the boundary scan chain in parallel.

6. The method of claim 1, wherein the step "performing the boundary scan test, and loading an EXTEST instruction to the device having the PAD" further comprises:
   loading the EXTEST instruction into the device having the PAD;
   loading the first test vector for outer testing.

7. The method of claim 1, wherein the step "removing first response data from a TDO port, and preforming response analysis and fault diagnosis" further comprises:
   removing the first response data from the TDO port, while sending a next test vector to a next PAD.

8. The method of claim 7, wherein "removing the first response data from the TDO port, while sending a next test vector to a next pad" further comprises:
- entering a CAPTURE-DR state, and capturing the first response data into the boundary scan register of the boundary scan chain in parallel;
- entering a SHIFT-DR state, serially moving out the first response data, and simultaneously moving the next test vector into the next PAD; and
- entering the UPDATE-DR state, and updating the next test vector into a boundary scan register of the boundary scan chain in parallel.

9. A non-transitory storage medium storing at least one program instruction, wherein a method is implemented when the program instruction is executed by a processor; and wherein the method comprises the following steps:
- configuring an FPGA to enter a test mode;
- configuring a boundary scan chain for a boundary scan test by means of the user logic;
- loading a boundary scan test instruction to the FPGA, and loading a PRELOAD instruction to a device having a PAD to be tested for connectivity;
- sending, a first test vector to the PAD via a TDI port;
- performing the boundary scan test, and loading an EXTEST instruction to the device having the PAD; and
- removing first response data from a TDO port and performing response analysis and fault diagnosis;
- wherein the step "configuring a boundary scan chain for a boundary scan test by means of the user logic" further comprises:
- according to a position and a quantity of PADs to be tested, configuring a boundary scan chain corresponding to the PADs to be tested one by one through the user logic.

10. The non-transitory storage medium of claim 9, wherein the boundary scan chain comprises several scan chain units which are connected in series to form a scan chain.

11. The non-transitory storage medium of claim 10, wherein the boundary scan chain comprises m scan chain units, the FPGA comprises n PADs, where m≤n.

12. The non-transitory storage medium of claim 9, wherein the step "configuring an FPGA to enter a test mode" further comprises:
- invoking a test interface of the boundary scan chain, and opening a channel connecting the FPGA and the user logic to enter the test mode.

13. The non-transitory storage medium of claim 9, wherein the step "S40, sending a first test vector to the pad via a TDI port" further comprises:
- entering a SHIRT-DR state, shifting the first test vector serially to the PAD through the TDI port; and
- entering a UPDATE-DR state, and updating the first test vector to a boundary scan register of the boundary scan chain in parallel.

14. The non-transitory storage medium of claim 9, wherein the step "performing the boundary scan test, and loading an EXTEST instruction to the device having the PAD" further comprises:
- loading the EXTEST instruction into the device having the PAD;
- loading the first test vector for outer testing.

15. The non-transitory storage medium of claim 9, wherein the step "removing first response data from a TDO port, and performing response analysis and fault diagnosis" further comprises:
- removing the first response data from the TDO port, idle sending a next test vector to a next PAD.

16. The non-transitory storage medium of claim 15, wherein "removing the first response data from the TDO port, while sending a next test vector to a next pad" further comprises:
- entering the CAPTURE-DR state, and capturing the first response data into a boundary scan register of the boundary scan chain in parallel;
- entering a SHIFT-DR state, serially moving out the first response data, and simultaneously moving the next test vector into the next PAD; and
- entering a UPDATE-DR state, and updating the next test vector into the boundary scan register of the boundary scan chain in parallel.

* * * * *